United States Patent
Walsh

(10) Patent No.: US 6,836,704 B2
(45) Date of Patent: Dec. 28, 2004

(54) METHOD AND APPARATUS FOR REGULATION OF ELECTRICAL COMPONENT TEMPERATURE THROUGH COMPONENT COMMUNICATION THROTTLING BASED ON CORRECTED SENSOR INFORMATION

(75) Inventor: Thomas E. Walsh, Banks, OR (US)

(73) Assignee: Intel Corporation, Santa Clara, CA (US)

(*) Notice: Subject to any disclaimer, the term of this patent is extended or adjusted under 35 U.S.C. 154(b) by 292 days.

(21) Appl. No.: 09/962,938

(22) Filed: Sep. 21, 2001

(65) Prior Publication Data

US 2003/0060934 A1 Mar. 27, 2003

(51) Int. Cl.[7] ............................................. G05D 23/00
(52) U.S. Cl. ........................... 700/299; 700/79; 365/211
(58) Field of Search .................. 700/299, 29; 365/211, 365/212

(56) References Cited

U.S. PATENT DOCUMENTS 6,021,076 A     2/2000  Woo et al. ................... 365/211
6,487,463 B1 * 11/2002  Stepp, III ..................... 700/79

* cited by examiner

Primary Examiner—Leo Picard
Assistant Examiner—Sheela S. Rao
(74) Attorney, Agent, or Firm—Kenyon & Kenyon

(57) ABSTRACT

A system is disclosed for the regulation of electrical component temperature through the throttling of component communication based on information provided by a sensor and corrected by a calibration table.

30 Claims, 5 Drawing Sheets

Temperature Regulation Based on Corrected, De-Coupled Temperature Reading

METHOD AND APPARATUS FOR REGULATION OF ELECTRICAL COMPONENT TEMPERATURE THROUGH COMPONENT COMMUNICATION THROTTLING BASED ON CORRECTED SENSOR INFORMATION

BACKGROUND INFORMATION

The present invention relates to temperature control. More specifically, the present invention relates to the regulation of electrical component temperature through the throttling of component communication based on information provided by a sensor and corrected by a component-specific calibration table.

Various methods exist in the art for controlling the temperature of electrical components in devices such as computers. An example of temperature regulation involves the utilization of one or more fans that operate continuously or periodically (under the direction of a controller based on control criteria) to move hot air away from the component(s). Problems with fan operation include a high level of noise as well as a substantial amount of energy consumption.

For computer temperature regulation, there is an effort currently by manufacturers to have the computer chipset (memory controller) 'predict' the thermal state of its associated memory device(s). This involves keeping a toll of recent accesses that may cause the device(s) to change temperature. When the chipset predicts that the memory device may exceed the prescribed temperature limits, it 'throttles' (slows down the rate of) subsequent accesses. This throttling is performed over a long enough period to allow the device(s) to return to some desired temperature, and the cycle is then repeated.

FIG. 1 illustrates the layout of a typical memory system of a computer. Data is accessed from (read) or placed in (write) memory, such as Synchronous Dynamic Random Access Memory (SDRAM) 102 by a memory controller (chipset) 104 to be utilized by a processor, such as a central processing unit (CPU) 106. In throttling accesses to regulate temperature by methods in the art based on prediction, the chipset must make pessimistic assumptions about the thermal characteristics of the system. In particular, the chipset must assume that the installed devices heat rapidly and cool slowly (not knowing anything about the specific devices installed in that machine). For systems with poor thermal management capabilities, this is a correct and necessary assumption. For systems with better thermal management (better air flow, for instance) this results in lower than desired (lower than necessary) system performance.

This method can be described as an "open loop" control strategy because it bases its temperature regulation on prediction under 'worst case' scenario, not on real-time temperature feedback ('closed loop' control).

FIG. 2 provides a flowchart describing an example process of predictive temperature regulation as used in the art. The memory device is read (or written to) 202 by the memory controller as is needed by the current operation. A count is being kept of the memory accesses with respect to time passage. As long as less than some prescribed threshold amount of memory accesses are performed in a unit of time 204, the memory will be continually accessed 202 without a throttling interruption (delay 206). If the number of accesses per unit of time exceeds the threshold amount, a delay 206 is incorporated after the subsequent access 208. During the delay 206, no memory accesses occur. Until a prescribed amount of cooling time has passed (established by 'worst case' scenario), there is an alternation 210 between memory accesses 208 and delay 206 to reduce the communication rate, thereby reducing device temperature. When the prescribed amount of cooling time has passed, the memory operation returns to the normal communication rate 212.

Another method in the art involves using a temperature sensor to read the 'actual' temperature of the memory and using this unadjusted temperature to determine a rate of memory operation. This method is provided in U.S. Pat. No. 6,021,076. Because no device-specific calibration is performed to compensate for differing thermal characteristics, the temperature sensor must be in direct thermal communication with the device, and it must be very accurate. Process technology may not readily produce a sensor with predictable and repeatable behavior, yielding a situation where the sensor temperature coefficient and linearity, for instance, vary from one device to another. Further, the electrical interface may not include provision for sensor signaling to the chipset. The addition of interface signals for this purpose would be very difficult and expensive. The standards bodies would need to revise the connector pinouts for commodity parts, impeding adoption.

FIG. 3 provides an illustration of a memory system utilizing non-corrected, 'actual' temperature measurement for temperature regulation as performed in the art. Because with this method there is no means for correcting imperfect temperature readings, the temperature sensor(s) 302 must be very accurate and are usually required to be in direct contact with the memory device(s) 304. As stated above, the kind of sensor accuracy necessary would be very expensive, and providing a sensor that is in direct thermal communication (e.g. direct contact) with the device would be very difficult and expensive.

It is therefore desirable to have a system for regulating temperature of electronic components that avoids the above-mentioned problems, improves performance for systems with better thermal management, and reduces manufacturing costs, in addition to having other advantages.

DETAILED DESCRIPTION

Figure 1:
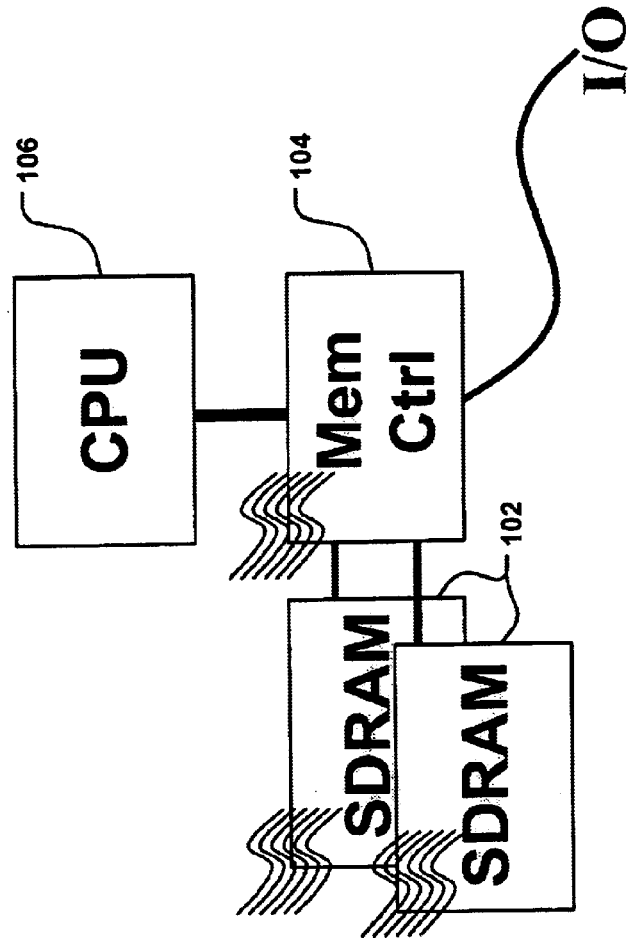
FIG. 1 illustrates the layout of a prior art memory system of a computer.
Figure 2:
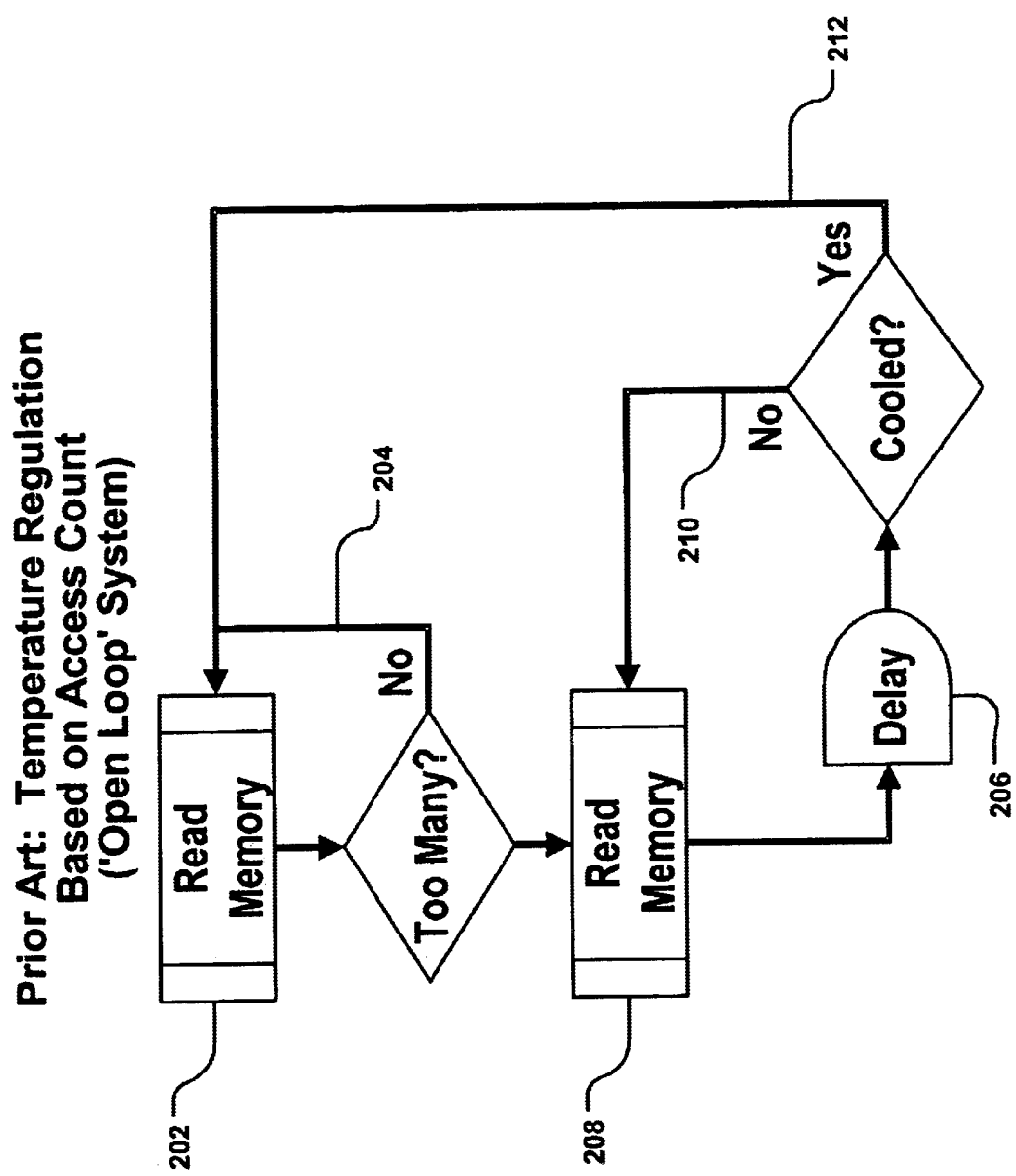
FIG. 2 provides a flowchart describing a prior art process of predictive temperature regulation as used in the art.
Figure 3:
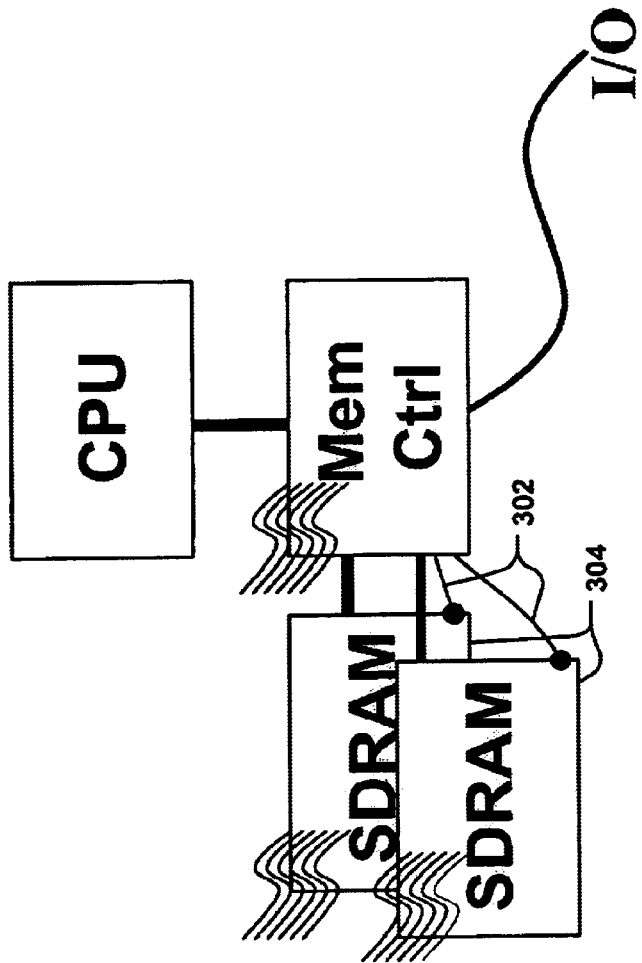
FIG. 3 provides an illustration of a prior art memory system utilizing non-corrected, 'actual' temperature measurement for temperature regulation as performed in the art.
Figure 4:
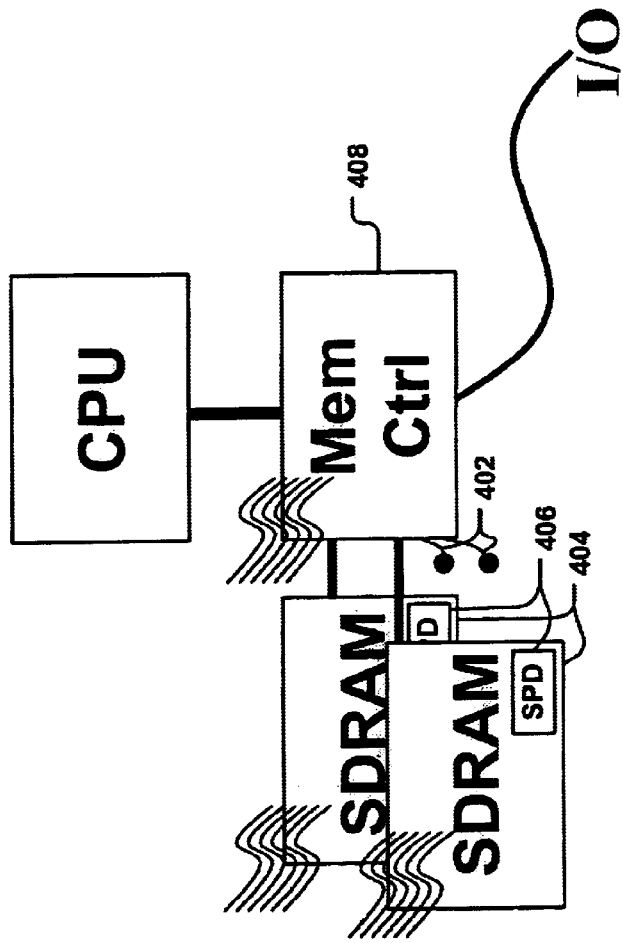
FIG. 4 provides an illustration of a system with component temperature regulation based on corrected, de-coupled temperature measurements under principles of the present invention.

FIG. 4 provides an illustration of a system with component temperature regulation based on corrected, de-coupled temperature measurements under principles of the present invention. In one embodiment of the invention, the memory controller utilizes temperature sensors 402, which do not need to be in direct contact with the measured memory device(s) (e.g. SDRAM 404).

SPD (Serial Presence Detect) Memory DRAM (Dynamic Random Access Memory) devices incorporate a small, serially accessed, memory device. The memory of this device is distinct from the memory the DRAM provides to a computer system in normal usage. This small memory device is used to store parameters of the DRAM, and enables a chip set memory controller to be configured to correctly access the DRAM. This storing of configuration data, and setting up the memory controller using it, is collectively known as "Serial Presence Detect" (or SPD). The memory used for storing the parameters is known as 'SPD memory.'

In one embodiment of the present invention, sensor calibration data is stored in SPD memory 406, and is read by the memory controller 408. Sensor 402 output is read from SPD memory 406 as "memory mapped I/O." In an embodiment, sensor data is updated as a digital value in the SPD memory 406. The chipset (memory controller) 408 periodically reads the sensor 402 output to determine device temperature. It corrects sensor data based on the calibration information. When the device temperature rises, the chipset 408 reduces the rate of read access until the device temperature stabilizes or lowers.

SPD memory is typically underutilized. As an example, Hyundai provides SDRAM components that utilize only 128 bytes of 256 available. The remaining SPD memory is available for other system uses. Even the 128 bytes that are "used" contain many unspecified "reserved" storage locations. If the sensor output includes eight significant bits, a seven-bit corrected output is available using 128 bytes of data.

As stated, in one embodiment, this invention provides SDRAM with a capability to incorporate thermal management without changing the electrical interface or the protocol on the main 'address' and 'data' interfaces (no temperature sensor 402 coupling is needed). In an embodiment, the ability is provided to make the feature optional, allowing manufacturers to add the capability slowly as the market uptake merits. Additionally, in an embodiment, the invention can be practiced without changing the layout of a motherboard, and with existing chipsets 408, in a deficient manner (e.g. implementation in software).

In one embodiment, two aspects of the invention are 1) use of the SPD 406 interface to obtain sensor 402 data and 2) de-coupling of sensor output from actual temperature. An embodiment of the current invention may be realized with a sensor with variable thermal properties including non-linearity, and variably positive or negative temperature coefficients. In an embodiment, the calibration map in the SPD would correct for linear and non-linear error seen by the sensor(s) 402. In an embodiment, empirical data would be utilized to establish the calibration table through a range of values, providing coefficients for temperature correction through a range of values. In an alternative embodiment, a component heatsink (not shown) may be used. The 'closed' control loop will simply incorporate the modified thermal behavior, whatever it may be.

Figure 5:
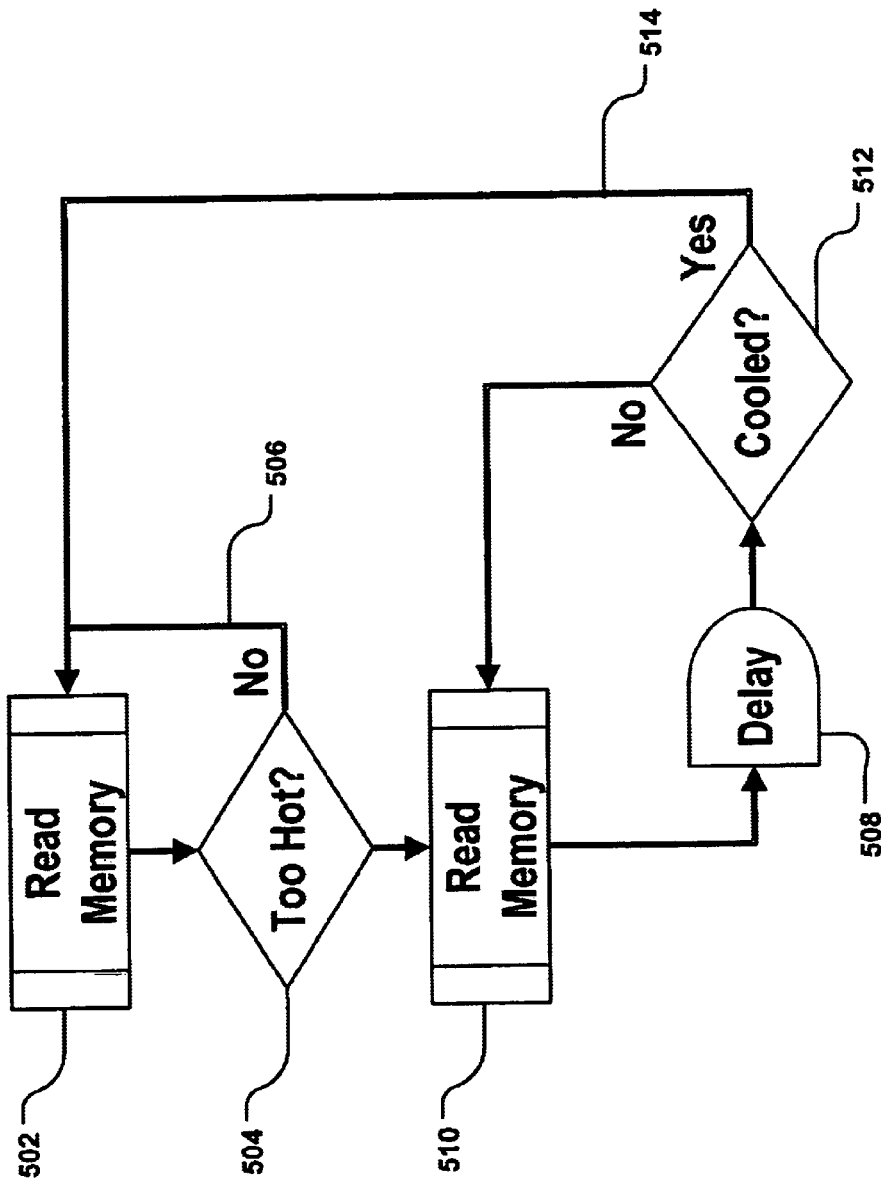
FIG. 5 provides a flowchart illustrative of temperature regulation based on corrected, de-coupled temperature reading under principles of the present invention.

FIG. 5 provides a flowchart illustrative of temperature regulation based on corrected, de-coupled temperature reading under principles of the present invention. In one embodiment, while or after making an access to memory, such as a read 502, temperature is determined through utilization of the sensor(s) 402 (See FIG. 4) with the calibration table in the SPD memory 406. In an embodiment, if 504 the calibration table-corrected temperature determination is below a pre-established threshold temperature, memory accesses continue at the same rate 506. If, however, the corrected temperature is determined to be above the threshold temperature, a fixed or variable delay 508 is incorporated after each memory access 510 (reducing the memory access rate) until it is determined 512 that the component(s) have cooled to a temperature below the threshold temperature 514. In one embodiment, the delay 508 is adaptive to certain parameters. Upon sensing a temperature above the threshold, a delay 508 of, for example, $T_a$ is instituted. If the temperature reading has not decreased to below the threshold temperature at the next analysis, a delay of $T_b$, which is greater than $T_a$, is utilized. This is done to minimize any negative effect on system performance caused by the cool down process.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A temperature controller system comprising:
a first component to communicate with a second component; wherein
said second component controls a communication rate with said first component based on a temperature input from a sensor and a calibration map based on characteristics of said sensor.

2. The system of claim 1, wherein the sensor is coupled to said second component and wherein said first component includes said calibration map.

3. The system of claim 2, wherein the sensor is physically detached from the first component.

4. The system of claim 2, wherein the calibration map is a table of calibration data specific to the first component.

5. The system of claim 2, wherein the calibration map is a table of calibration data specific to the combined thermal characteristics of the first component in thermal communication with the second component.

6. The system of claim 2, wherein the first component is an electronic memory device and the second component is a memory controller.

7. The system of claim 6, wherein the electronic memory device is Dynamic Random Access Memory (DRAM).

8. The system of claim 7, wherein the electronic memory device includes the calibration map in Serial Presence Detect (SPD) memory.

9. The system of claim 8, wherein the calibration map is utilized to compensate for sensor-specific thermal characteristics.

10. The system of claim 9, wherein the calibration map is a calibration table developed from experimental data representative of the specific sensor's thermal characteristics.

11. A method to control the temperature of electrical components, the method comprising:
communicating by a first component with a second component at a communication rate; and
controlling, by said second component, said communication rate based on a temperature input from a sensor and a calibration map, which is based on characteristics of said sensor.

12. The method of claim 11, wherein the sensor is coupled to said second component and wherein said first component includes said calibration map.

13. The method of claim 12, wherein the sensor is physically detached from the first component.

14. The method of claim 12, wherein the calibration map is a table of calibration data specific to the first component.

15. The method of claim 12, wherein the calibration map is a table of calibration data specific to the combined thermal characteristics of the first component in thermal communication with the second component.

16. The method of claim 12, wherein the first component is an electronic memory device and the second component is a memory controller.

17. The method of claim 16, wherein the electronic memory device is Dynamic Random Access Memory (DRAM).

18. The method of claim 17, wherein the electronic memory device includes the calibration map in Serial Presence Detect (SPD) memory.

19. The method of claim 18, wherein the calibration map is utilized to compensate for sensor-specific thermal characteristics.

20. The method of claim 19, wherein the calibration map is a calibration table developed from experimental data representative of the specific sensor's thermal characteristics.

21. A set of instructions residing in a storage medium, said set of instructions capable of being executed by a processor to control the temperature of electrical components, the method comprising:

communicating by a first component with a second component at a communication rate; and controlling, by said second component, said communication rate based on a temperature input from a sensor and a calibration map, which is based on characteristics of said sensor.

22. The set of instructions of claim 21, wherein the sensor is coupled to said second component and wherein said first component includes said calibration map.

23. The set of instructions of claim 22, wherein the sensor is physically detached from the first component.

24. The set of instructions of claim 22, wherein the calibration map is a table of calibration data specific to the first component.

25. The set of instructions of claim 22, wherein the calibration map is a table of calibration data specific to the combined thermal characteristics of the first component in thermal communication with the second component.

26. The set of instructions of claim 22, wherein the first component is an electronic memory device and the second component is a memory controller.

27. The set of instructions of claim 26, wherein the electronic memory device is Dynamic Random Access Memory (DRAM).

28. The set of instructions of claim 27, wherein the electronic memory device includes the calibration map in Serial Presence Detect (SPD) memory.

29. The set of instructions of claim 28, wherein the calibration map is utilized to compensate for sensor-specific thermal characteristics.

30. The set of instructions of claim 29, wherein the calibration map is a calibration table developed from experimental data representative of the specific sensor's thermal characteristics.

* * * * *